United States Patent
Huber

(10) Patent No.: US 7,622,790 B2
(45) Date of Patent: Nov. 24, 2009

(54) TRANSISTOR ASSEMBLY AND METHOD FOR MANUFACTURING SAME

(75) Inventor: Jakob Huber, Beyharting (DE)

(73) Assignee: Infineon Technologies AG, Munich (DE)

( * ) Notice: Subject to any disclaimer, the term of this patent is extended or adjusted under 35 U.S.C. 154(b) by 906 days.

(21) Appl. No.: 11/127,765

(22) Filed: May 11, 2005

(65) Prior Publication Data

US 2005/0263851 A1    Dec. 1, 2005

(30) Foreign Application Priority Data

May 11, 2004    (DE)    ........................ 10 2004 023 193

(51) Int. Cl.
*H01L 27/102* (2006.01)

(52) U.S. Cl. ........................ 257/588; 257/592; 257/557; 257/563; 257/E29.184

(58) Field of Classification Search ............... 257/588, 257/E29.184
See application file for complete search history.

(56) References Cited

U.S. PATENT DOCUMENTS 6,034,402 A * 3/2000 Ammo et al. ............... 257/370
6,043,553 A    3/2000 Suzuki
6,664,609 B2   12/2003 Ito et al.
6,838,709 B2   1/2005 Sonetaka
2002/0036325 A1 * 3/2002 Johansson ................. 257/361
2004/0075108 A1   4/2004 Sonetaka et al.
2005/0081999 A1 * 4/2005 Yasui et al. ............. 156/345.28

FOREIGN PATENT DOCUMENTS

EP    0 951 174 A2    10/1999
JP    11297707        10/1999
JP    2004134630      4/2004
WO    WO 00/28599 A1  5/2000

* cited by examiner

*Primary Examiner*—Tu-Tu V Ho
(74) *Attorney, Agent, or Firm*—Maginot, Moore & Beck

(57) ABSTRACT

A transistor assembly having a transistor includes a plurality of transistor regions, each of which has a vertical transistor structure having a collector semiconductor region, a base semiconductor region and an emitter semiconductor region, emitter contacting regions arranged above the transistor regions and base contacting regions connected to the base semiconductor regions via a polycrystalline semiconductor layer, wherein the polycrystalline semiconductor layer is structured such that the base contacting regions of transistor regions which are not part of the transistor are electrically isolated from base contacting regions of transistor regions which are part of the transistor.

12 Claims, 8 Drawing Sheets

TRANSISTOR ASSEMBLY AND METHOD FOR MANUFACTURING SAME

CROSS-REFERENCE TO RELATED APPLICATION

This application claims priority from German Patent Application No. 10 2004 023 193.1, which was filed on Apr. 11, 2004, and is incorporated herein by reference in its entirety.

BACKGROUND OF THE INVENTION

1. Field of the Invention

The present invention relates to a transistor assembly and to a method for manufacturing it, wherein structures in a polycrystalline semiconductor layer determine which parts of a transistor region are electrically isolated from other parts of another transistor region.

2. Description of Related Art

High-frequency transistors are usually grouped in technology families. Very flat doping profiles and minute geometries are characteristic of high-frequency transistors. Emitter and base contacts are arranged like fingers at the surface. In one prior art embodiment in a discrete high-frequency transistor type, the collector is connected from the back-side, or in another prior art embodiment and when the high-frequency transistor is arranged on an integrated circuit or IC, it is additionally supplied from the surface. In a number of prior art embodiments, the individual types within one technology family often only differ by the number of emitter and base fingers. In prior art embodiments, the low-level signal transistors typically have between 1 and about 50 emitter fingers, whereas in power transistors the number of fingers is in the order of magnitude of up to 1000.

In prior art embodiments where discrete high-frequency low-level signal transistors are employed, the transistor area actively utilized is often only a minute portion of the entire area of the chip. The boundary conditions of processability in mounting, however, require a certain minimum size for the chip.

In many prior art embodiments, the minimum chip area required today is about $0.20 \times 0.20$ mm$^2$. Thus, a considerable portion of the chip area often remains unused, which makes the costs for manufacturing considerably higher than would be the case if the chip area corresponded to the transistor area actively utilized.

In order to make use of remaining empty chip area, a number of manufacturers producing transistors according to prior art embodiments have turned to arranging several transistor cells on a chip, which can be connected in different ways depending on the requirements in the metal level. The demand for photo masks is limited in this way.

Furthermore, in these prior art embodiments, the manufacturers of transistor assemblies can react more flexibly to changing customer requirements since it is only decided at the end of the wafer process or the manufacturing process of the wafers which one of the optional types will finally be produced.

A number of manufacturers of high-frequency transistors according to prior art embodiments employ the traditional planar process or variations or modifications thereof, wherein it is inevitable in such multiple designs for each of the transistor cells on the chip to be arranged in a way isolated from the others. FIG. 8 explains a transistor structure of a prior art embodiment.

A layer 11 positioned at the bottom of an assembly illustrated in FIG. 8 serves as a collector contact. A layer 21 arranged above it forms a collector 21. A base well 31 is arranged on a surface of the collector 21 facing away from the collector contact 11 and covers a part of this surface. The remaining part of the surface of the collector 21 facing away from the collector contact is covered by a field oxide 61.

Base contactings 41 arranged below base contacts 81 and emitter regions 51 positioned below emitter contacts 91 are introduced alternatingly into the base well 31 on the surface facing away from the collector 21. The base well 31 is covered by an oxide layer 71 serving as an isolator between the emitter contact or the base contact and the base well 31.

The field oxide 61, the oxide layer 71 and the base contact 81 and the emitter contacts 91 are coated with a passivation layer 101. In a prior art planar process illustrated here, the base well 31 into which all the emitter fingers 51 of a transistor cell are introduced is required.

In order to utilize a conventional chip area for a mass production process, which in prior art embodiments is often about 0.04 mm$^2$, sensibly and economically, many different transistor types, quite often as many as possible, are accommodated on a single chip in prior art embodiments.

FIG. 7 explains such a prior art embodiment. There are three ways of forming a high-frequency transistor on a chip setup shown on FIG. 7. These three ways are to electrically connect either a transistor cell A 201 or a transistor cell B 211 or a transistor cell C 221 to an emitter pad 231 and a base pad 241.

In a scenario A where an activated transistor cell comprises one emitter finger, base fingers 201A are connected to the base pad 241 via a conductive track 201D, whereas an emitter finger 201B is connected to the emitter pad 231 via an emitter conductive track 201E in an electrically conducting way. It is to be pointed out here that the conductive track 201E between the emitter pad and the transistor cell A 201 and the conductive track between the base pad 241 and the transistor cell 201 are illustrated in continuous lines in FIG. 7.

In a scenario B, a transistor cell B 211 is connected, wherein a conductive track 211D is formed as a conductive track between the base pad and the transistor cell B 211 and a conductive track 211E is formed as a conductive track between the emitter pad 231 and the transistor cell B 211. The conductive tracks 211D, 211E implemented in this variation are illustrated in broken lines. The base conductive track 211 D thus connects the base pad 241 to four base fingers 211A, whereas the emitter pad 231 is connected to all three emitter fingers of the transistor cell B 211 via the emitter conductive track 211E. In scenario B, the chip of FIG. 7 is formed as a transistor assembly consisting of the transistor cell B, the transistor assembly now including three emitter fingers.

In a scenario C, the chip illustrated in FIG. 7 is formed as a transistor cell C having seven emitter fingers 221B. The base conductive track 221D and the emitter conductive track 221E are illustrated in dotted lines.

The chip illustrated in FIG. 7 can now be formed both as the transistor cell A 201 having one emitter finger 201B, as the transistor cell B 211 having three emitter fingers 211B or as the transistor cell C 221 having seven emitter fingers 221B. An electrical performance of the transistor formed on the chip depends on which transistor cell has been selected for the design. The electrical performance of the transistor is decisively determined by the number of emitter fingers.

In the sense of consistent cost optimization, the principle of multiple usage can be pushed to the limits, which means that as many different transistor types as possible may be accommodated on a single chip. It immediately becomes obvious that the area cannot be made use of optimally due to the requirement of minimum spacings between the individual transistor cells A 201, B 211, C 221. In addition, only predetermined transistor cells or combinations thereof may be manufactured as a transistor type in this method.

The limitation illustrated here is a consequence of the planar process.

SUMMARY OF THE INVENTION

It is an object of the present invention to provide a transistor having a plurality of transistor regions and a method for manufacturing it, wherein the transistor can be manufactured more easily and cost-effectively.

In accordance with a first aspect, the present invention provides a transistor assembly having a transistor, including a plurality of transistor regions, each of which has a vertical transistor structure having a collector semiconductor region, a base semiconductor region and an emitter semiconductor region, emitter contacting regions arranged above the transistor regions, base contacting regions connected to the base semiconductor regions via a polycrystalline semiconductor layer, wherein the polycrystalline semiconductor layer is structured such that the base contacting regions of transistor regions which are not part of the transistor are electrically insulated from base contacting regions of transistor regions which are part of the transistor.

In accordance with a second aspect, the present invention provides a discrete transistor element having a transistor assembly mentioned above, wherein the transistor regions which are not part of the transistor are not connected to perform a transistor function.

In accordance with a third aspect, the present invention provides a method for manufacturing a transistor assembly having a plurality of transistor regions, each of which has a vertical transistor structure having a collector semiconductor region, a base semiconductor region and an emitter semiconductor region, emitter contacting regions arranged above the transistor regions, base contacting regions connected to the base semiconductor regions via a polycrystalline semiconductor layer, the method having the step of: structuring the polycrystalline semiconductor layer such that the base contacting regions of transistor regions which are not part of the transistor are electrically isolated from base contacting regions of transistor regions which are part of the transistor.

The present invention is based on the finding that in particular discrete transistor elements may be manufactured easily and cost-effectively when for example at first a maximum number of transistor regions fitting on a discrete element are provided, the base contact regions of which are connected via a polycrystalline semiconductor layer, whereupon, corresponding to desired features of the discrete transistor element, a required number of transistor regions is determined and all the transistor regions beyond are electrically separated by structuring the polycrystalline semiconductor layer. Thus, base contacting regions of transistor regions which are not part of a transistor are electrically isolated from base contacting regions of transistor regions which are part of a transistor.

In contrast to the planar process, there is not common base well in the double poly process described in the above paragraph. Each individual emitter finger has its own base and thus is a fully functional transistor which can be operated independently of the other fingers of the transistor cell.

It follows that a concept having spatially separated transistor cells is no longer required with such a manufacturing process. This allows a considerably improved utilization of the chip area present and thus an improvement of the cost situation of the transistor manufactured according to this method.

In addition, partial transistors having many single finger transistors can be generated as required from a single large basic cell. Also, there is no limitation with regard to the number of fingers of the partial transistors. Thus, increased flexibility is possible to manufacture a high variation of different transistors having different electrical features from one basic chip design.

This approach of manufacturing a large number of different transistor variations from one base design of a chip also facilitates the manufacturing of transistors in a front end location or wafer manufacturing facility adapted for mass production.

Apart from facilitating a mass production of transistor variations of most different kinds, the number of masks required for manufacturing the different chip variations also decreases. This also contributes to facilitating the manufacturing process and decreasing the transit times when manufacturing a custom transistor since a dedicated set of masks need not be produced for this.

Since it is even possible in one embodiment of the present invention to only determined the electrical performance of a transistor assembly formed on a chip on the metallization level, custom requirements can still be reacted to in a very late manufacturing step. This allows stocking transistor chips pre-manufactured to a high degree, which are adapted to custom requirements in a very small number of final manufacturing steps with regard to their electrical performance.

At the same time, it facilitates so-called shrinking or utilizing a smaller structural width for manufacturing the chip since only a basic design instead of a plurality of variations is to be implemented in a technology with a smaller structural width.

BRIEF DESCRIPTION OF THE DRAWINGS

Preferred embodiments of the present invention will be detailed subsequently with reference to the appended drawings, in which.

DESCRIPTION OF THE PREFERRED EMBODIMENTS

Figure 1:
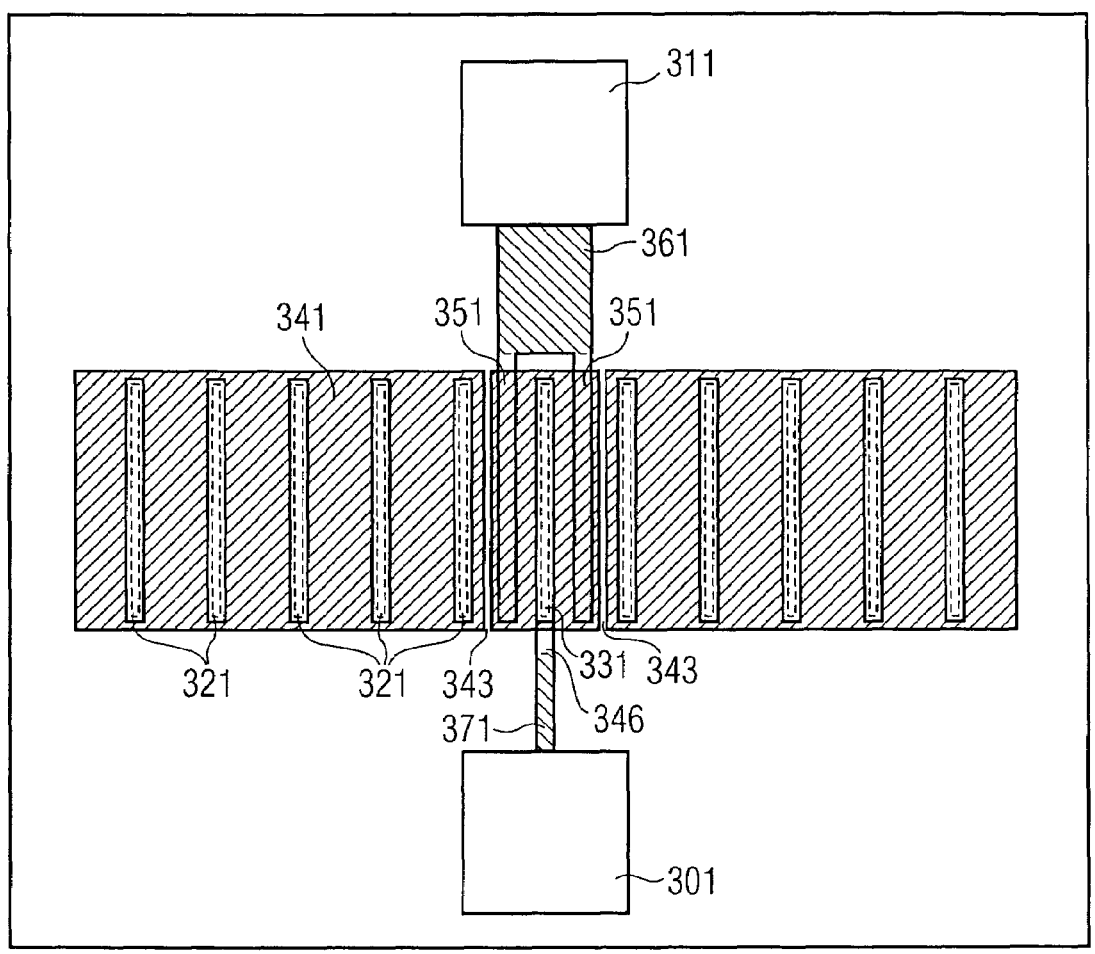
FIG. 1 shows a transistor assembly according to the present invention having one emitter finger.

FIG. 1 shows a top view of a configuration of an embodiment of the present invention. The layout or configuration of a transistor assembly of an embodiment of the present invention is illustrated. An emitter terminal 301, a base terminal 311, a transistor field 341, a base conductive track 361 and an emitter conductive track 371 are illustrated in this configuration. The transistor field 341 includes non-connected emitter regions 321, a connected emitter region 331, recesses or isolating regions 343, an emitter finger 346 and two base fingers 351.

The emitter terminal 301 is connected to the emitter finger 346 via the emitter conductive track 371 in an electrically conducting way, the base terminal 311 is connected to the two base fingers 351 via the base conductive track 361 in an electrically conducting way. By suitably selecting the configuration of the emitter fingers 346 and the base fingers 351 or the number thereof, the number of connected emitter regions 331 and non-connected emitter regions 321 can be determined and thus the electrical performance of a high-frequency transistor formed according to a layout of an embodiment of the present invention can be adjusted.

The configuration or number of connected emitter regions 331 and non-connected emitter regions 321 is determined in the metallization level of the chip or, as will be discussed later, maybe on an underlying poly mask. The recesses or isolating regions 343 of the transistor field thus separate the respective regions of the transistor field 341 including connected emitter regions 331 and non-connected emitter regions 321. The other regions and layers of the chip, however, remain uninfluenced by the number of connected emitter regions 331 or by the configuration of the connected emitter regions 331 and always have the same setup and the same design.

Figure 2:
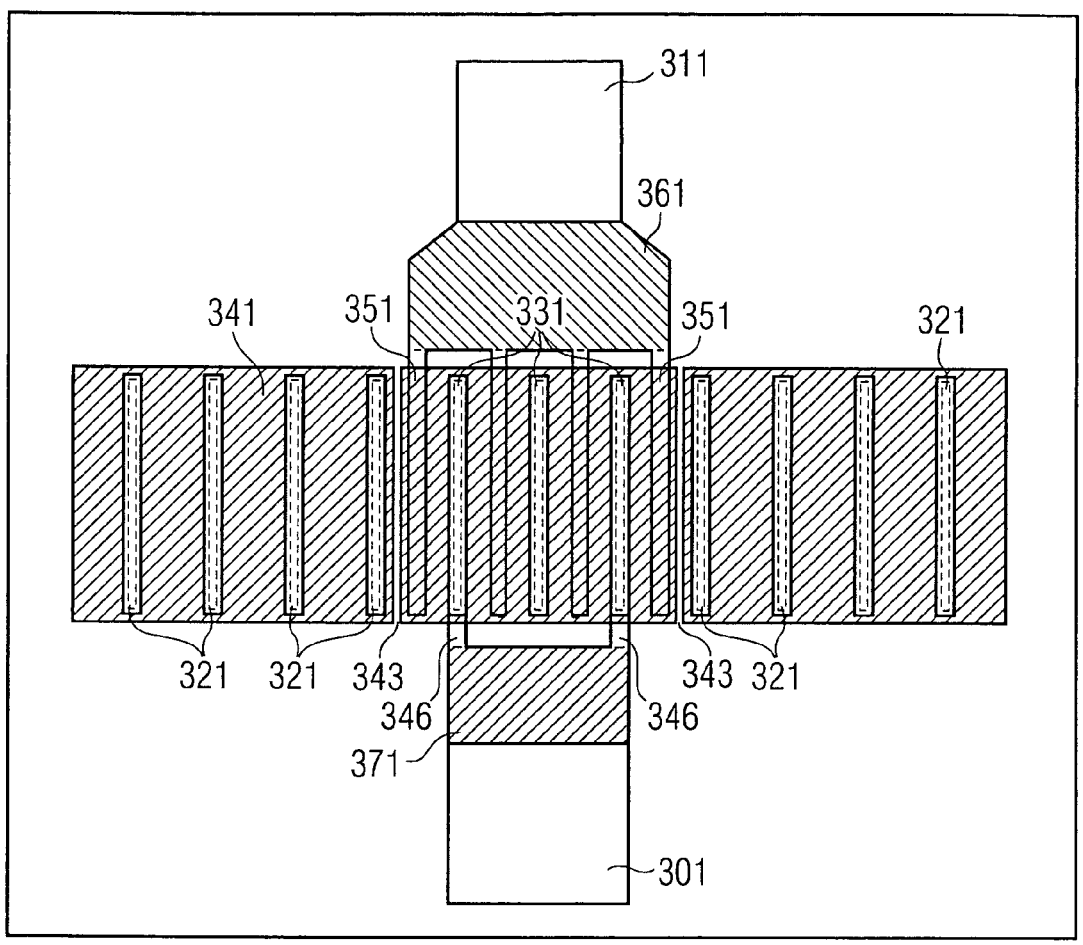
FIG. 2 shows a transistor assembly according to the present invention having three emitter fingers.

FIG. 2 explains another embodiment of a transistor assembly according to the present invention. The difference of the configuration of the transistor assembly of FIG. 2 from the configuration of the transistor assembly of FIG. 1 is that, in FIG. 2, the number of connected emitter regions 331 is three, whereas, in FIG. 1, it is one, and that the transistor assembly of FIG. 2 comprises four base fingers 351 instead of two base fingers 351.

Figure 3:
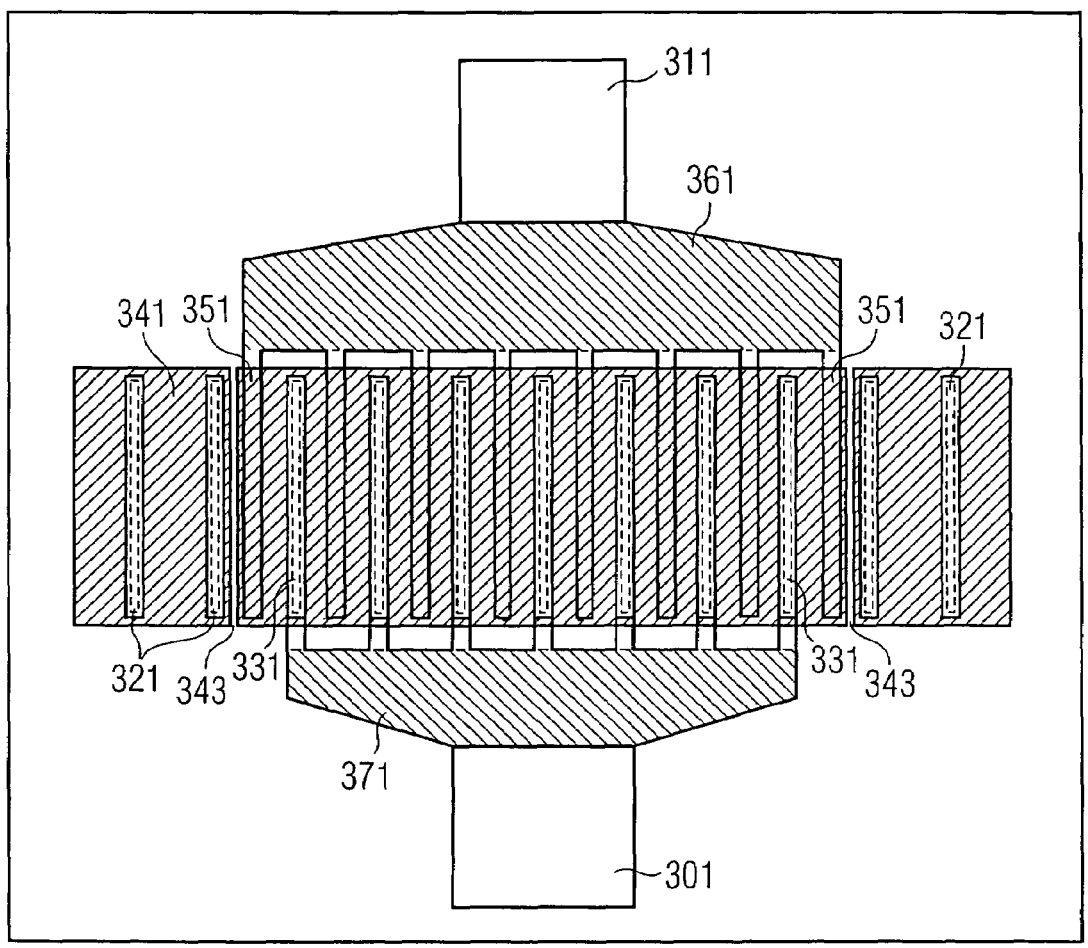
FIG. 3 shows a transistor assembly according to the present invention having seven emitter fingers.

FIG. 3 shows another embodiment of the present invention. In this configuration, the number of connected emitter regions 331 is seven and the transistor assembly illustrated here has a total of eight base fingers 351. The transistor assemblies illustrated in FIGS. 1-3 all comprise the same transistor field 341 having the same number and arrangement of emitter regions 321, 331. They only differ in the configuration of the connected emitter regions 331 and the non-connected emitter regions 321, which is, as will be explained later, determined on the metallization level or on the poly level. Thus, the transistor assemblies illustrated in FIGS. 1-3 show that a plurality of different transistors all differing in the number of connected emitter regions 331 and non-connected emitter regions 321 can be produced from one basic concept of the transistor cell 341. Even the electrical performance depending on the number of connected emitter regions 331 can thus be varied without changing the basic concept of the transistor cell 341.

All in all, eleven different transistor variations, all differing in the number of emitter fingers 346 and thus in the electrical performance, the implementation of which only differs on the metallization level or poly level can be produced from the basic concept of the transistor cell 341 illustrated in FIGS. 1-3. This illustrates the flexibility of the transistor types manufacturable from the basic concept of the transistor cell 341.

Figure 4:
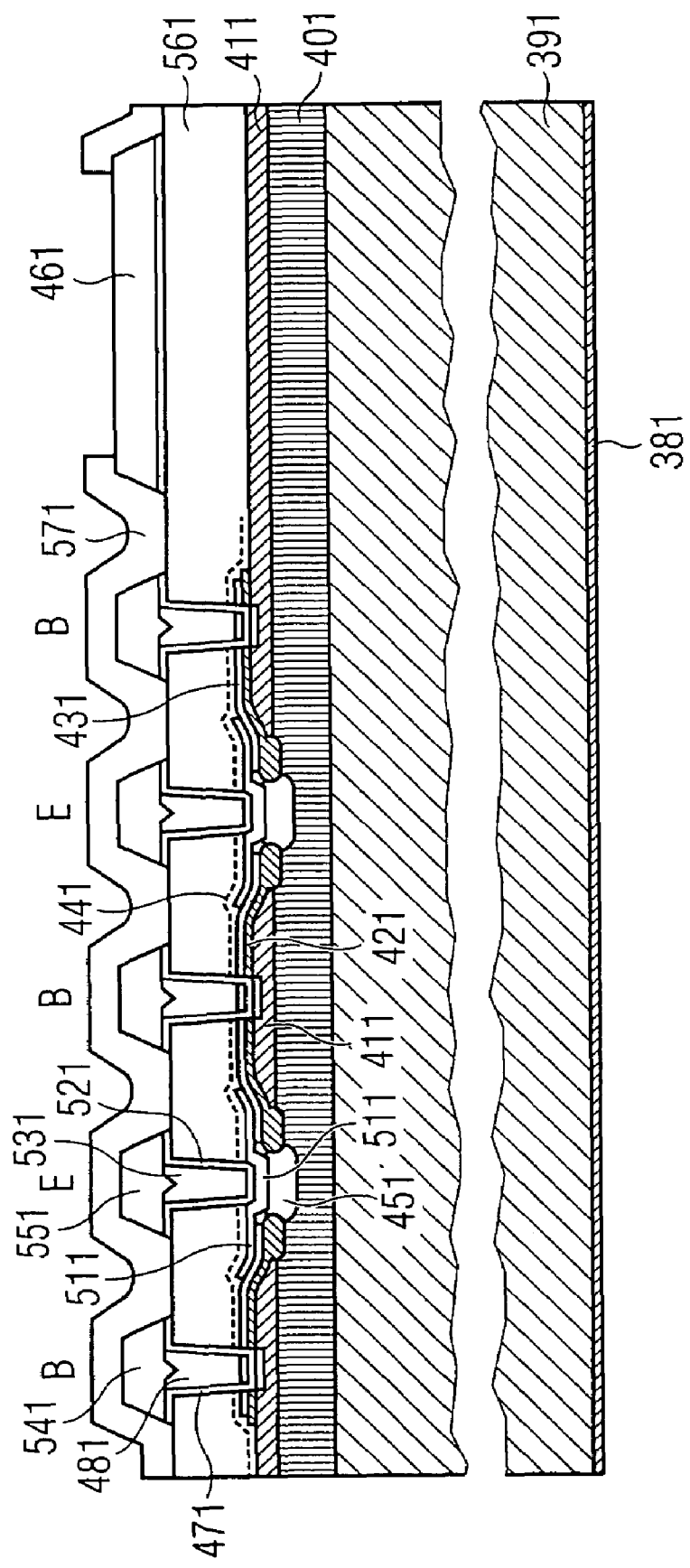
FIG. 4 shows an implementation of a transistor assembly according to the present invention on a semiconductor substrate.

FIG. 4 explains an implementation of an embodiment of the present invention in a semiconductor substrate. A transistor assembly according to the present invention shown here has a collector contact 381 at its bottom and a collector contacting 391 above it, onto which the collector layer 401 is deposited. Above the collector layer 401, there are regions of a field oxide 411 electrically isolating the collector layer 401 from at least a part of a surface of a p-poly semiconductor layer 421. Another part of a surface of the collector layer 401 facing away from the collector contacting 391 is covered by the p-poly semiconductor layer 421 and by a base layer 451.

The p-poly semiconductor layer 421 is connected in an electrically conducting way to a base finger 541 via a base contacting region 471 which comprises an adhesive layer 471 for example made of a double layer of titanium and titanium nitride, and a base contact hole or base contacting 481 for example made of tungsten. According to the same principle, an emitter layer 511 is connected in an electrically conducting way to the emitter finger 551 via an emitter contacting region 521 comprising, similarly to the base contacting region, an adhesive layer 521 and an emitter contact hole 531.

The p-poly semiconductor layer 421 is coated with an oxide layer 431 which electrically isolates the emitter layer 511 from the p-poly contacting 421 so that a charge-carrier flow may only take place from the base layer 451 into the emitter layer 511 but not from the p-poly semiconductor layer 421 into the emitter layer 511.

The oxide layer 431 and the emitter layer 511 are coated with an oxide cover 441 onto which an oxide isolation 561 is deposited. It is the task of the oxide isolation 561 and the oxide cover 441 to electrically isolate the base contacting 471 from the emitter layer 511 and the emitter contacting 521 so that only the transistor regions below the emitter fingers 551 are connected electrically.

The metal pad 461 and a passivation 571 are arranged on the oxide isolation 561.

Figure 8:
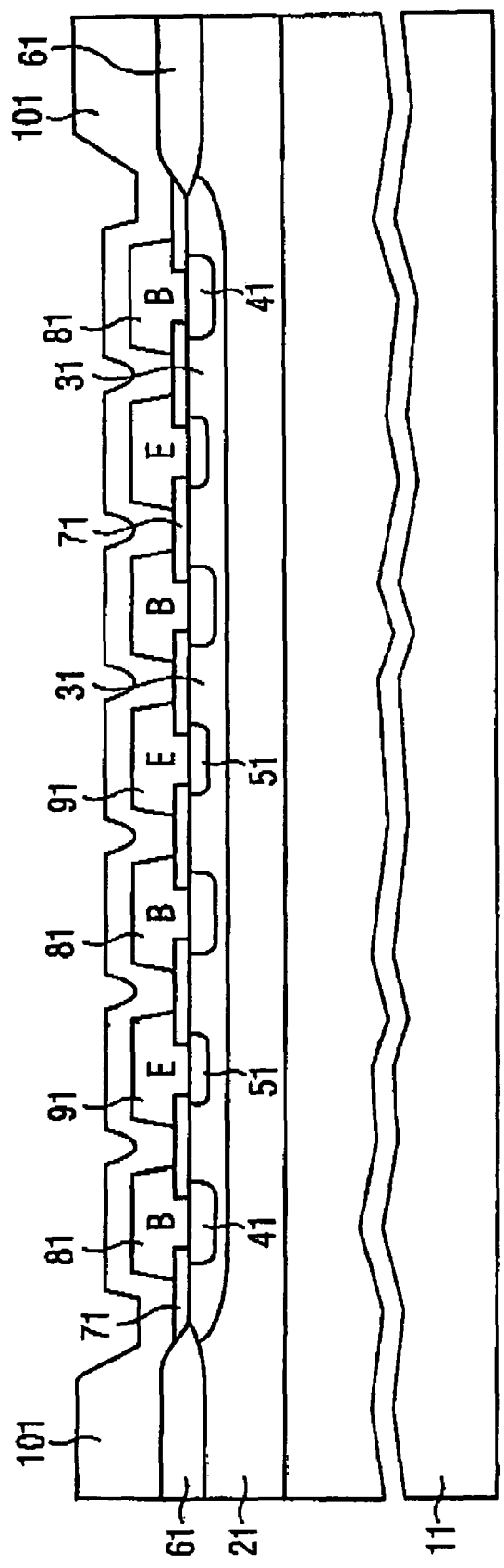
FIG. 8 shows a layer setup of a prior art transistor assembly.

In contrast to the planar process by means of which the transistor assembly illustrated in FIG. 8 has been manufactured, there is no longer a common base well in the transistor assembly, shown in FIG. 4, manufactured by a double poly process. Each individual emitter finger 346 has its own base and thus is a fully functional transistor which can be operated independently of the other fingers of the transistor cell. It follows that a concept having spatially separated transistor cells is no longer necessary with such a manufacturing process.

Rather, partial transistors having many single finger transistors may be produced as required from a single large basic cell. Additionally, there is no limitation with regard to the number of fingers of the partial transistors. The individual emitter fingers 346 are connected to one another via the p-poly layer 421 which connects the base contacting 471 to the base layer 451 in an electrically conducting way so that by means of only one second mask in addition to the metallization mask it can be provided for emitter fingers not required to be electrically separated from one another.

In the transistor assembly shown in FIG. 4, it is solely the geometry or configuration or extent of the p-poly layer 421 to determine which emitter fingers 551 belong to an active transistor and which emitter fingers 346 are electrically isolated from it. The electrical performance of the transistor assembly shown in FIG. 4 thus only depends on the setup of the p-poly layer 421.

Thus, the number of the emitter fingers 346 connected to the transistor assembly can be varied by suitable recesses or isolation regions in the p-poly layer 421, and thus the electrical performance of the transistor assembly can be influenced.

It follows that a concept of spatially separated transistor cells is no longer required with such a manufacturing process. Rather, transistors with any number of single finger transistors may be generated as required from a single large basic cell. Additionally, there is no limitation relating to the number of fingers of the partial transistors.

The maximum number of transistor regions on a chip, which can be connected, depends on the technology in which the chip is manufactured, i.e. on the structural width and the outer dimensions of the chip. The number of transistor regions connected is then determined by the configuration of the p-poly layer and by the number of emitter and base fingers, the number being between one transistor region and the maximum possible number of transistor regions of the chip.

Figure 5:
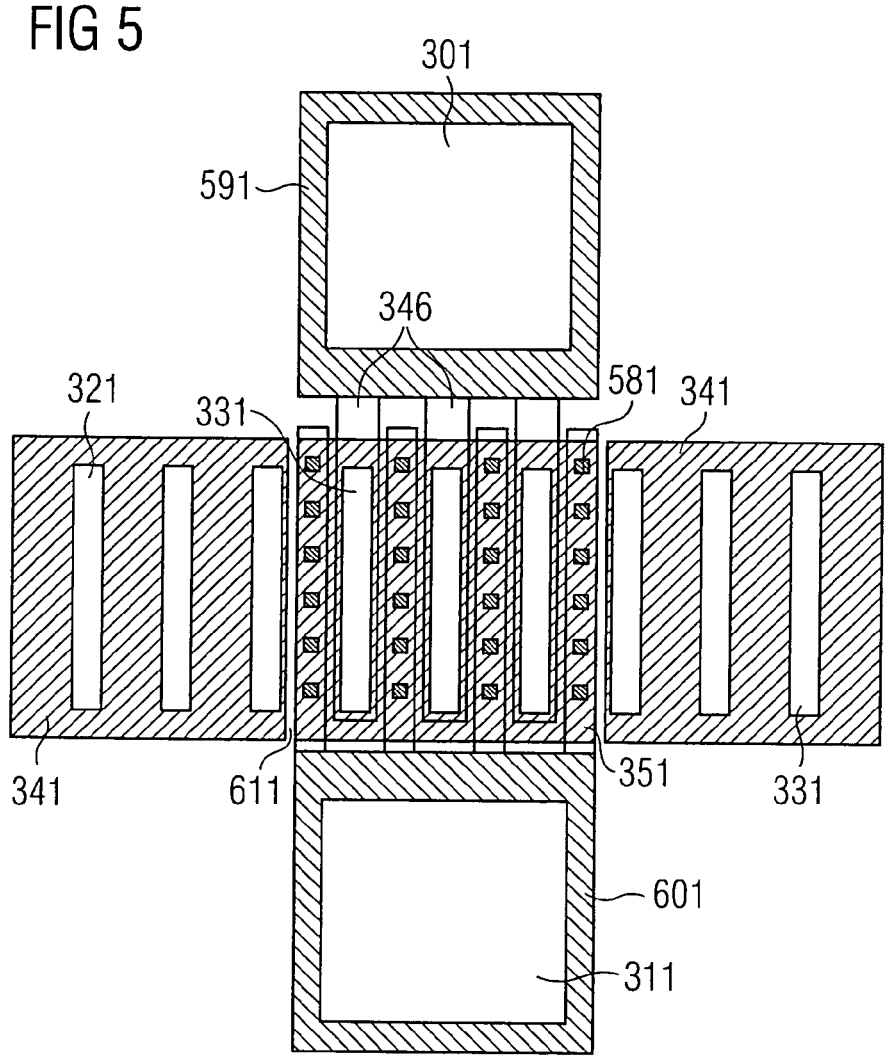
FIG. 5 shows a transistor assembly according to the present invention having contact holes for contacting the base contactings.

FIG. 5 shows another embodiment of the present invention where recesses 611 are introduced into the p-poly layer 421. A transistor assembly shown here is connected to a circuit board not shown here via the emitter terminal 301 and the base terminal 311 by bond wires or directly. The transistor assembly shown here includes three transistor fields 341 electrically separated from one another by recesses 611 in the p-poly layer 421.

The connected emitter regions 331 are connected to the emitter terminal 301 via the emitter fingers 346 and a following emitter metallization 591. Base through contactings 581 are connected to the base terminal 311 via base fingers 351 and a following base metallization 601.

The electrical performance of the transistor assembly or the number of activated emitter fingers 346 and base fingers 351 can be determined by the arrangement or configuration of recesses 611 in the p-poly layer 421 and the arrangement of the base metallization 601, the emitter metallization 591, the base fingers 351 and the emitter fingers 346. The individual transistor regions only differ in their setup by the recesses 611 in the p-poly layer 421, the emitter fingers 346, the base fingers 351, the emitter metallization 591 and the base metallization 601. Thus, a large portion of the manufacturing steps for transistor types having different electrical performances but similar setups only differing in the number of emitter fingers 346 and base fingers 351 is identical. Only two type-specific photo levels are required to determine the number of connected and non-connected base and emitter fingers, respectively.

Thus, different transistor types with different electrical performances can be established from one basic concept of a circuit design by alterations in the p-poly mask and the metallization masks determining the number of emitter and base regions connected.

Figure 6:
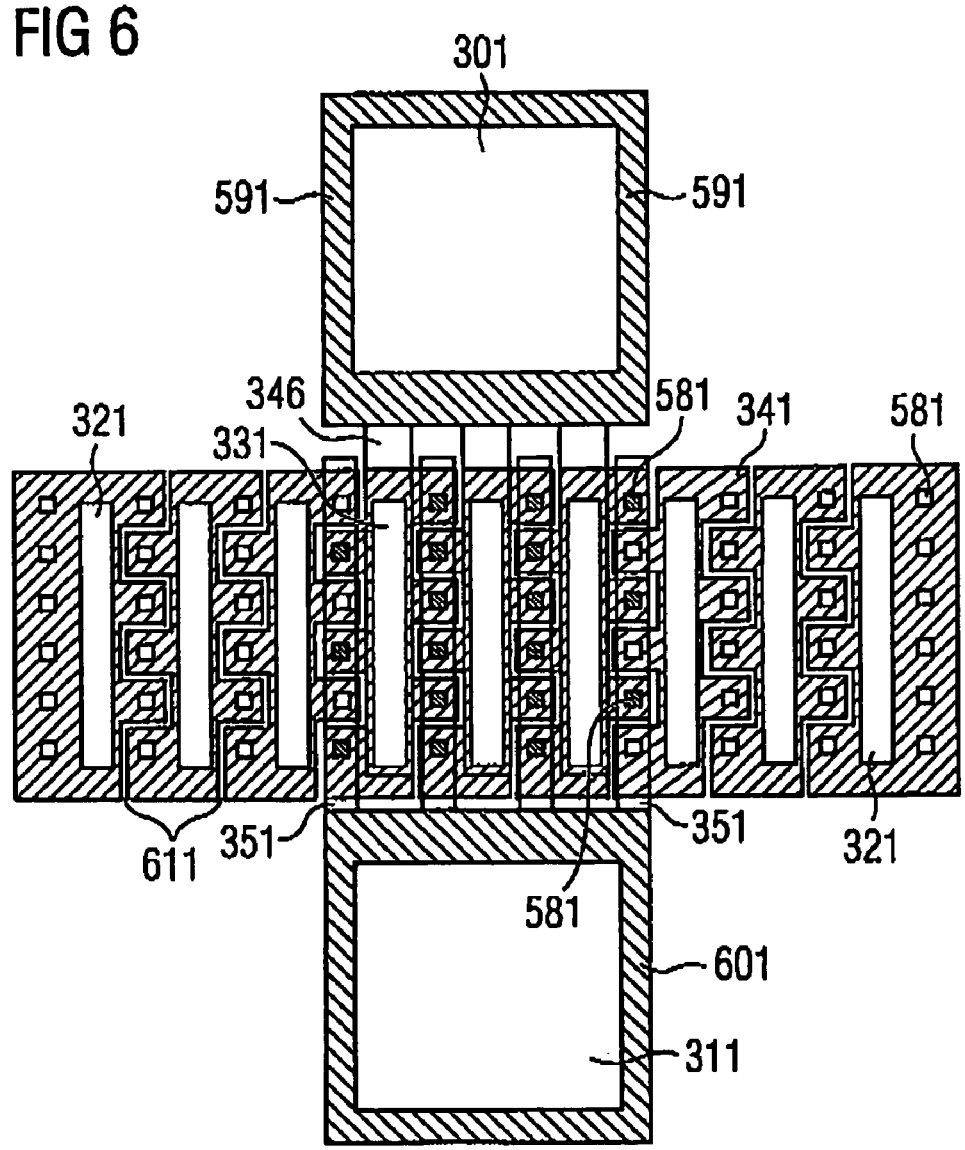
FIG. 6 shows a transistor assembly according to the present invention, where the number of emitter and base fingers can be adjusted at a metallization level.
Figure 7:
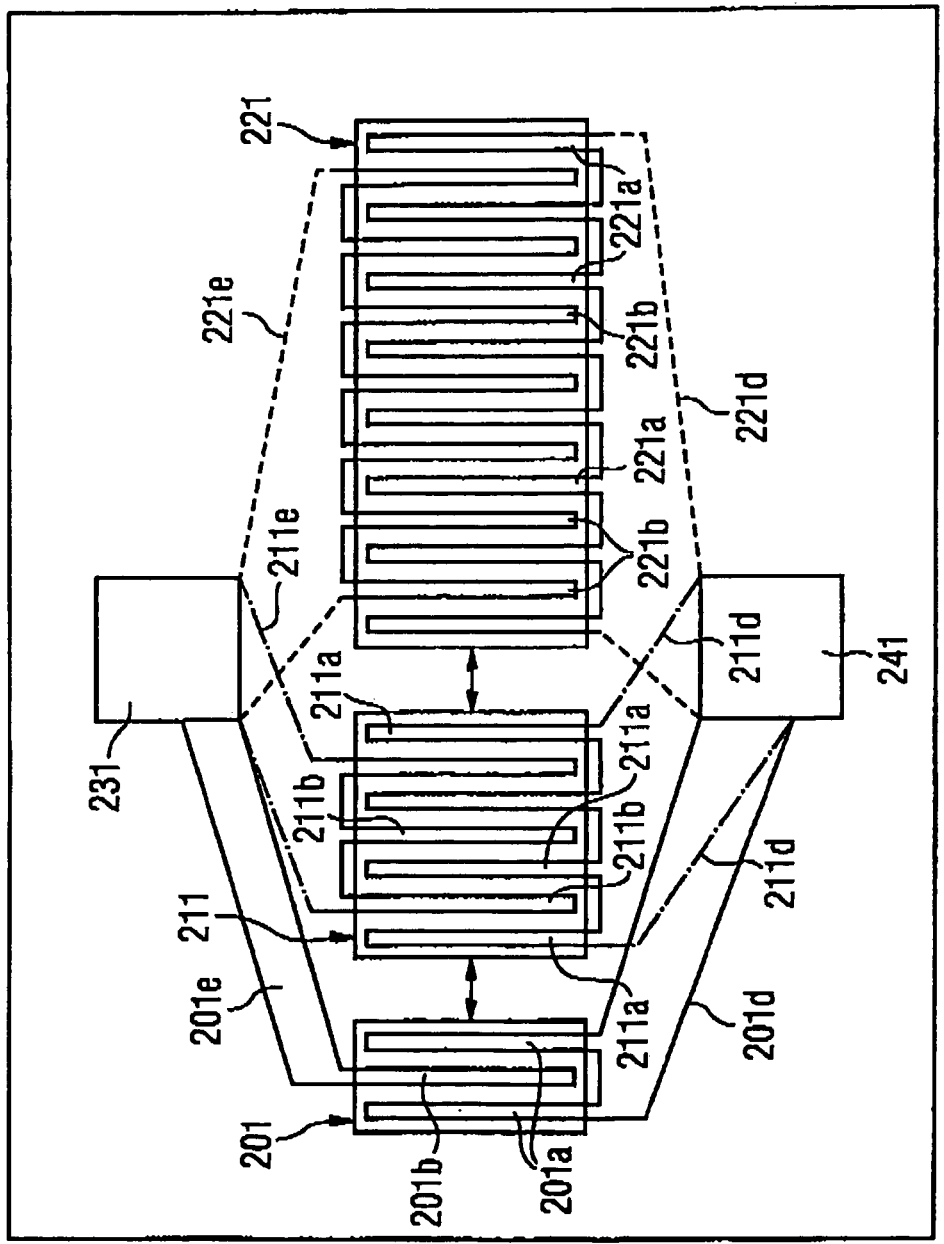
FIG. 7 shows an implementation of different transistor cell variations on a single chip according to the prior art.

FIG. 6 explains another embodiment of the present invention. The transistor assembly shown here is characterized by the fact that each emitter region, independently of whether it is connected or non-connected, is electrically isolated from the neighboring emitter region by recesses 611 in the p-poly layer 421.

In contrast to the transistor assembly according to an embodiment of the present invention shown in FIG. 5, each of the emitter regions 321, 331 is electrically isolated from the neighboring emitter region 321, 331 by meander-shaped recesses 611 in the p-poly layer 421. A connection of the emitter regions 331 only takes place via the emitter metallization 591 and the emitter fingers 346, the configuration of which is also established in the metallization mask. Even the configuration of the base fingers 351 and the base metallization 601 is determined in the metallization mask.

All in all, the transistor assembly shown in FIG. 6 includes nine transistor fields. Thus, transistor types between one and nine emitter fingers or one and nine connected emitter regions can be established by a suitable selection of the metallization masks. At the same time, it is to be mentioned here that the transistor types here differing in the number of the connected emitter regions 311 by the factor nine may all be manufactured from one basic design of all the masks, except for the masks determining the metallization levels. This again indicates the great flexibility of the transistor types manufactured according to the embodiment of the present invention.

There is no limit for the single large transistor basic cell by a different connection of the metallization, such as, for example, when manufacturing transistor assemblies in the present figure having one, three or seven emitter fingers. The decision for a certain transistor type takes place only by selecting the metallization mask.

For reasons of clarity, only the through contactings of the base fingers belonging to the transistor are shown in FIGS. 5-6. Corresponding through contactings for the emitter fingers are not illustrated. In preferred embodiments of the present invention, a plurality of different transistor types having considerably differing electrical features may be manufactured with, according to FIG. 5, two different photo masks and with, in FIG. 6, even one different photo mask with otherwise identical masks. Thus, there are through contactings, which are not illustrated either in FIGS. 5 or 6, in the regions not belonging to the transistor (i.e. isolated by a corresponding structuring of the poly layer and/or the metallization layer). It may be of advantage to cover these through contactings not belonging to the transistor by a suitable blind cover, in particular when the through contactings comprise tungsten. Suitable blind covers can, for example, be structured together with the base and emitter metallizations in a way isolated from them using the same method steps.

In the above embodiments of the present invention, the emitter regions 321, 331 are rectangles arranged in parallel to one other, wherein, however, the shapes of both the emitter regions and the transistor fields 341 may take any configuration, wherein the emitter regions 321, 331 may, for example, have an oval shape.

In the above embodiments, any semiconducting material, such as, for example, gallium arsenide, germanium or silicon, may be selected as the basic material for implementing the transistor assemblies. Furthermore, the contacting between further switching structures and the emitter layer 511 and the p-poly semiconductor layer 421 may take place in any form, such as, for example, via highly doped conductive tracks, and is not limited to the emitter fingers 551 or base fingers 541 illustrated in the above embodiments.

The above embodiments according to the present invention include transistor types formed as discrete elements. Alternatively, a transistor assembly according to the above embodiments can also be deposited on a chip having further switching structures and the performance of even the switching structure can be varied correspondingly depending on the design of the transistor type according to the present invention.

When the dopings of the other layers, such as, for example, collector layer 401, base layers 451, emitter layer 511, are adjusted correspondingly, an n-poly layer is used as an alternative to the p-poly layer employed in the above embodiments. Even though npn transistors are described in the above embodiments, a reversal of the doping kinds and thus an implementation of pnp transistors are also possible. The oxide layers 411, 431, 441 employed here may also be replaced by alternative isolation layers.

The contacting of the p-poly semiconductor layer 421 and the emitter layer 511 may also be made by means of alternatives to the above embodiments of the present invention, such as, for example, by planar conductive tracks of other switching structures on the chip including a transistor assembly according to the present invention.

In the above embodiments, the individual emitter fingers 346 are connected to one another via the p-poly layer, i.e. the base contact 421, wherein it must be provided for the emitter fingers 346 not required to be electrically separated using a second mask. Two possibilities have been mentioned for this in the above embodiments, of which one includes a design of an individual p-poly mask for each production type where the part of the poly layer lying outside is separated, and a second possibility where a common segmented p-poly mask is employed. In the common segmented p-poly mask, the selection of the desired transistor cell is established by means of the contact hole or the via level, as is illustrated in FIG. 6, wherein the poly mask is segmented and neighboring segments are interdigitated like fingers.

A suitable metal mask only connecting the segments required, is required for the cell design illustrated in FIG. 6.

Even though the concept here has principally been described for a transistor having a collector terminal at the back-side, a restricted usage is also conceivable in transistors having a buried layer and collector contact. A restriction here, however, would result since the buried layer has a parasitic capacity to the substrate. A partial transistor would consequently be loaded by the capacity of an entire cell.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A transistor assembly having a transistor, comprising:
a plurality of transistor regions including a first set and a second set, each transistor region comprising a vertical transistor structure comprising a collector semiconductor region, a base semiconductor region and an emitter semiconductor region;
emitter contacting regions arranged above the transistor regions;
base contacting regions connected to the base semiconductor regions via a polycrystalline semiconductor layer; and
wherein the polycrystalline semiconductor layer is structured such that base contacting regions of the first set of transistor regions which are not part of the transistor are electrically isolated from base contacting regions of the second set of transistor regions which are part of the transistor,
wherein the polycrystalline semiconductor layer is further structured such that the base semiconductor regions of the second set of transistor regions are not connected to one another via the polycrystalline layer in an electrically conducting way.

2. The transistor assembly according to claim 1, wherein the base contacting regions of the second set of transistor regions are connected to one another in an electrically conducting way via a first metallization layer and are further connected to a base terminal.

3. The transistor assembly according to claim 1, wherein the emitter contacting regions of the second set of transistor regions are connected to one another in an electrically conductive way via a second metallization and are further connected to an emitter terminal.

4. The transistor assembly according to claim 1, wherein each of the transistor regions includes a finger-shaped structure.

5. The transistor assembly according to claim 1, wherein the base contacting regions are arranged between the emitter contacting regions.

6. A transistor assembly having a transistor, comprising:
a plurality of transistor regions including a first set and a second set, each transistor region comprising a vertical transistor structure comprising a collector semiconductor regions, a base semiconductor region and an emitter semiconductor region:
emitter containing regions arranged above the transistor regions;
based contacting regions connected to the base semiconductor regions via a polycrystalline semiconductor layer; and
wherein the polycrystalline semiconductor layer is structured such that base contacting regions of the first set of transistor regions which are not part of the transistor are electrically isolated from base contacting regions of the second set of transistor regions which are part of the transistor,
wherein the polycrystalline semiconductor layer comprises recesses between the base semiconductor regions such that the base semiconductor regions of the second set of transistor regions are not connected via the polycrystalline semiconductor layer in a conducting way, wherein the recesses define interdigitating regions of portions of the polycrystalline semiconductor layer.

7. The transistor assembly according to claim 6, wherein the recesses of the interdigitating regions define one or more of a group consisting of a meander-shaped pattern and a zig-zag-shaped pattern.

8. The transistor assembly according to claim 6, wherein the base contacting regions comprise through contactings which in the region of the interdigitating regions are conductively connected to the polycrystalline semiconductor layer.

9. A method for manufacturing a transistor assembly having a transistor, comprising:
providing a plurality of transistor regions, each of which comprises a vertical transistor structure comprising a collector semiconductor region, a base semiconductor region and an emitter semiconductor region, emitter contacting regions arranged above the transistor regions, base contacting regions connected to the base semiconductor regions via a polycrystalline semiconductor layer,
structuring the polycrystalline semiconductor layer such that the base contacting regions of a first set of transistor regions which are not part of the transistor are electrically isolated from base contacting regions of a second set of transistor regions which are part of the transistor; and
depositing and structuring a metallization layer to generate a base metallization connecting the base contact regions of the transistor in an electrically conducting way,
wherein the step of structuring the polycrystalline semiconductor layer includes electrically isolating base contacting regions from the first set of transistor regions, the first set of transistor regions being a quantity of transistor regions of the plurality of transistor regions in excess of a quantity of transistor regions required to obtain a set of predetermined electrical features of the transistor.

10. The method according to claim 9, wherein the structuring of the polycrystalline semiconductor layer includes etching using an etching mask having a structure defining the second set of transistor regions.

11. The method according to claim 10, wherein the polycrystalline semiconductor layer is structured such that each base semiconductor region in the polycrystalline layer is electrically isolated from the other base semiconductor regions, wherein a predetermined number of base semiconductor regions are connected to one another electrically by the step of depositing and structuring the metallization layer, to obtain a transistor having predetermined electrical features.

12. The method according to claim 9, wherein in the step of structuring the metallization layer, an emitter metallization connecting the emitter contacting regions of the transistor in an electrically conducting way is generated.

* * * * *